(12) United States Patent
Hsiao et al.

(10) Patent No.: US 7,956,948 B2
(45) Date of Patent: Jun. 7, 2011

(54) PIXEL STRUCTURE

(75) Inventors: Chia-Chiang Hsiao, Hsinchu (TW); Cheng Lo, Hsinchu (TW); Chih-Jen Hu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 86 days.

(21) Appl. No.: 12/578,562

(22) Filed: Oct. 13, 2009

(65) Prior Publication Data

US 2010/0025692 A1    Feb. 4, 2010

Related U.S. Application Data

(63) Continuation of application No. 12/098,466, filed on Apr. 7, 2008, now Pat. No. 7,728,917.

(30) Foreign Application Priority Data

Jan. 8, 2008    (TW) .............................. 97100659 A

(51) Int. Cl.
*G02F 1/136*    (2006.01)

(52) U.S. Cl. ................ 349/43; 349/38; 349/42; 257/59; 257/E29.151; 257/E29.273

(58) Field of Classification Search .................. 438/149, 438/157, 163; 349/42, 43, 38; 257/59, 72, 257/E29.151, E29.117, E29.137, E29.202, 257/E29.273
See application file for complete search history.

(56) References Cited

U.S. PATENT DOCUMENTS

2004/0238822 A1 * 12/2004 Meng et al. ..................... 257/72
* cited by examiner

*Primary Examiner* — N Drew Richards
*Assistant Examiner* — Yu-Hsi Sun
(74) *Attorney, Agent, or Firm* — Jianq Chyun IP Office

(57) ABSTRACT

A pixel structure formed on a substrate and electrically connected with a scan line and a data line, and including a semiconductor pattern and a pixel electrode is provided. The semiconductor pattern includes at least two channel areas, at least one doping area, a source area, and a drain area. The channel areas are located below the scan line and have different aspect ratios. The doping area is connected between the channel areas. The pixel electrode electrically connects the drain area, the source area is connected between one of the channel areas and the data line, and the drain area is connected between the other channel area and the pixel electrode. The scan line has different widths above different channel areas, and a length of each channel area is substantially equal to the width of the scan line.

16 Claims, 7 Drawing Sheets

US 7,956,948 B2

PIXEL STRUCTURE

CROSS-REFERENCE TO RELATED APPLICATION

This is a continuation application of patent application Ser. No. 12/098,466, filed on Apr. 7, 2008, which claims the priority benefit of Taiwan patent application serial no. 97100659, filed on Jan. 8, 2008. The entirety the above-mentioned patent application is hereby incorporated by reference herein and made a part of specification.

BACKGROUND OF THE INVENTION

1. Field of the Invention

The present invention generally relates to a pixel structure, in particular, to a pixel structure having multiple channel areas.

2. Description of Related Art

Currently, thin film transistor liquid crystal displays (TFT-LCDs) have become a mainstream display among various flat panel displays. The TFT-LCDs may be classified into amorphous silicon TFT-LCDs and low-temperature polysilicon thin film transistor (LTPS-TFT) LCDs depending on the different materials of the channel layer.

Since the electron mobility of the LTPS-TFT may reach 200 $cm^2$/V-sec or more, the TFT device may be made to have a smaller area so as to meet the requirement of high aperture ratio, further to increase the display brightness of the display and reduce the overall power consumption. Comparatively, the LTPS-TFT also has a high leakage current (about $10^{-9}$ µA), and a hot carrier effect may be easily induced at the drain to degrade the device. Therefore, recently, a light doped drain (LDD) is usually disposed between the channel area and the source/drain in the LTPS-TFT or a multi-channel area design is used to avoid the above problems.

FIG. 1 shows a pixel structure of a conventional polysilicon TFT-LCD. Referring to FIG. 1, the pixel structure 100 includes a scan line 110, a data line 120, a polysilicon layer 130, and a transparent pixel electrode 140. The scan line 110 has at least one L-shaped branch 112, and the polysilicon layer 130 intersects with the L-shaped branch 112 to form a first channel area 132 and a second channel area 134. Moreover, a low-temperature polysilicon layer 130 is provided with a source area 136 and a drain area 138 at its two ends, so as to form a multi-channel polysilicon TFT 150. The data line 120 is electrically connected with the source area 136, and the transparent pixel electrode 140 is electrically connected with the drain area 138. Moreover, the overlapping portion of the polysilicon layer 130 and the pixel electrode 140 further forms a storage capacitor 152. Due to the multi-channel design, the LTPS-TFT 150 staying in the turn-off state has a low leakage current, which helps to improve the performance of the pixel structure 100. However, the arrangement of the L-shaped branch 112 influences the location of the storage capacitor 152 and reduces the display aperture ratio of the pixel structure 100.

SUMMARY OF THE INVENTION

Accordingly, the present invention is directed to a pixel structure, for solving the problem of a limited display aperture ratio of the pixel structure in the polysilicon TFT having a multi-channel design.

The present invention provides a pixel structure disposed on a substrate and electrically connected with a scan line and a data line. The pixel structure includes a semiconductor pattern and a pixel electrode. The semiconductor pattern includes at least two channel areas, at least one doping area, a source area, and a drain area. The channel areas are located below the scan line and have different aspect ratios. The doping area is connected between the channel areas. The pixel electrode is electrically connected with the drain area, the source area is connected between one channel area and the data line, and the drain area is connected between the other channel area and the pixel electrode. The scan line has different widths above different channel areas, and a length of each channel area is substantially equal to a width of the scan line.

In an embodiment of the present invention, the scan line has different widths above different channel areas, and a length of each channel area is substantially equal to the width of the scan line.

In an embodiment of the present invention, the scan line has a branch substantially perpendicular to the scan line. At least one channel area is located below the branch, and the length of the channel area below the branch is substantially equal to a width of the branch.

In an embodiment of the present invention, the semiconductor pattern includes a polysilicon pattern.

In an embodiment of the present invention, the semiconductor pattern further includes a capacitor electrode electrically connected with the drain area and the pixel electrode, and located below the pixel electrode. Moreover, the pixel structure further includes a common electrode disposed between the capacitor electrode and the pixel electrode.

In an embodiment of the present invention, the doping area is in an L shape or a U shape.

In an embodiment of the present invention, a part of the scan line below the channel area, the source area, and the drain area form a polysilicon TFT.

The present invention also provides a pixel structure, which includes a scan line, a data line, a semiconductor pattern, and a pixel electrode. The scan line interlaces with the data line, and has a branch located below the data line. The semiconductor pattern includes at least two channel areas, at least one doping area, a source area, and a drain area. The channel areas are located below the scan line, and have different aspect ratios. The doping area is connected between the channel areas. The pixel electrode is electrically connected with the drain area, the source area is connected between one channel area and the data line, and the drain area is connected between the other channel area and the pixel electrode.

In an embodiment of the present invention, a length of the channel area below the branch is substantially equal to a width of the branch.

In an embodiment of the present invention, the semiconductor pattern includes a polysilicon pattern.

In an embodiment of the present invention, the semiconductor pattern further includes a capacitor electrode electrically connected with the drain area and the pixel electrode, and located below the pixel electrode. Moreover, the pixel structure further includes a common electrode disposed between the capacitor electrode and the pixel electrode.

In an embodiment of the present invention, the capacitor electrode and the branch are respectively located at two sides of the scan line.

In an embodiment of the present invention, the doping area is in an L shape.

In an embodiment of the present invention, the semiconductor pattern extends from a first side of the data line to a second side of the data line.

In an embodiment of the present invention, a part of the scan line below the channel area, the source area, and the drain area form a polysilicon TFT.

The present invention utilizes the variation of the semiconductor pattern to make the semiconductor pattern and the scan line to at least intersect in two areas, so as to reduce the leakage current of the polysilicon TFT. Moreover, the present invention arranges the branch of the scan line below the data line, so as to further avoid influencing the display aperture ratio of the pixel structure. On the whole, the pixel structure provided by the present invention has a high display aperture ratio, and the polysilicon TFT in the pixel structure has a good electrical property.

In order to the make aforementioned and other objects, features and advantages of the present invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
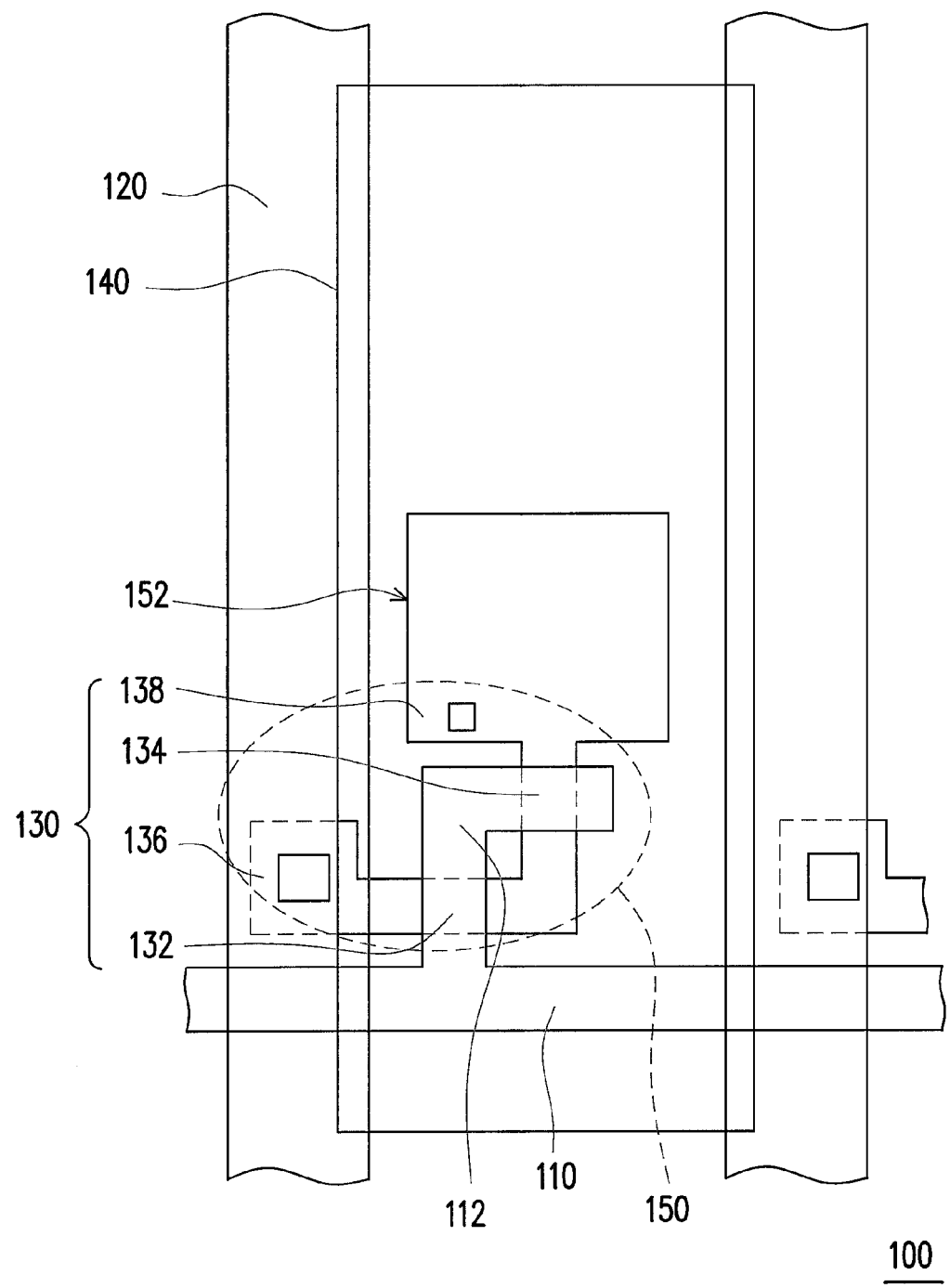
FIG. 1 is a schematic view of a pixel structure of a conventional polysilicon TFT-LCD.

Reference will now be made in detail to the present preferred embodiments of the invention, examples of which are illustrated in the accompanying drawings. Wherever possible, the same reference numbers are used in the drawings and the description to refer to the same or like parts.

Figure 2:
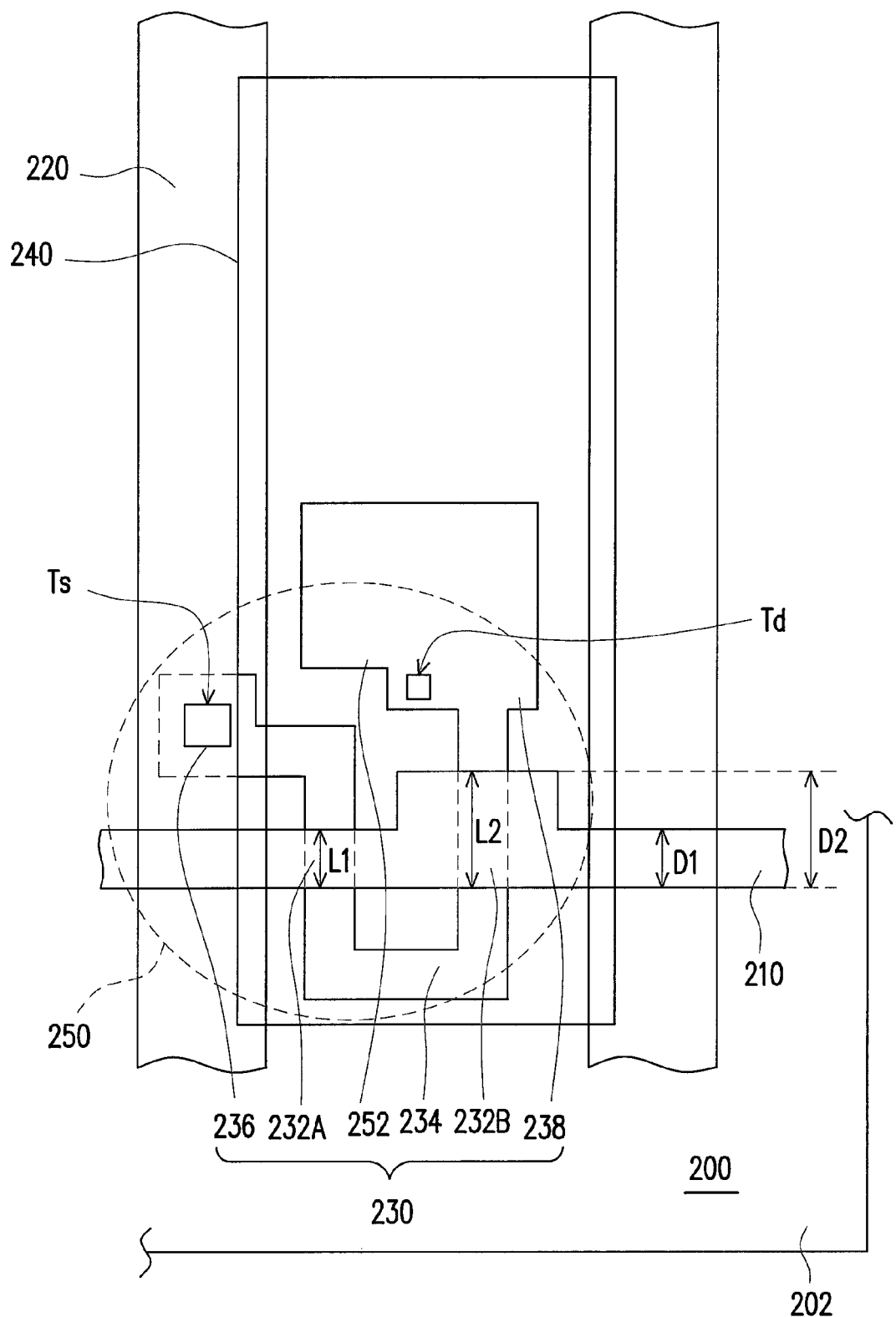
FIG. 2 is a schematic view of a pixel structure according to an embodiment of the present invention.

FIG. 2 shows a pixel structure according to an embodiment of the present invention. Referring to FIG. 2, the pixel structure 200 is electrically connected with a scan line 210 and a data line 220, and the scan line 210 interlaces with the data line 220. The pixel structure 200, the scan line 210, and the data line 220 are, for example, disposed on a substrate 202. The pixel structure 200 includes a semiconductor pattern 230 and a pixel electrode 240. The semiconductor pattern 230 includes at least two channel areas 232A, 232B, at least one doping area 234, a source area 236, and a drain area 238. The channel areas 232A, 232B are located below the scan line 210, and have different aspect ratios. Here, the aspect ratios of the channel areas 232A and 232B represent the ratios of width over length of the channel area 232A and 232B, i.e. the W/L ratio of the channel area 232A and 232. The doping area 234 is connected between the channel area 232A and the channel area 232B. The pixel electrode 240 is electrically connected with the drain area 238. The source area 236 is connected between the channel area 232A and the data line 220, and the drain area 238 is connected between the channel area 232B and the pixel electrode 240.

The part of the scan line 210 below the channel area 232A and the channel area 232B is considered as a gate in the pixel structure 200 for controlling the turn-on and turn-off of the pixel structure 200. Moreover, the semiconductor pattern 230 is, for example, made of a polysilicon material, i.e., the semiconductor pattern 230 is a polysilicon pattern. Therefore, a part of the scan line 210 below the channel area 232A and the channel area 232B, the source area 236, and the drain area 238 together form a polysilicon TFT 250. When the polysilicon TFT 250 is turned off, the grain boundary of the polysilicon pattern in the channel areas 232A, 232B may cause a current leakage, so as to affect the performance of the pixel structure 200. In order to solve the current leakage problem caused when the polysilicon TFT 250 is turned off, a multi-channel concept is brought forward. However, based on the prior art, a branch extending from the scan line 210 to achieve the multi-channel design may affect the display aperture ratio of the pixel structure 200. Therefore, the present invention provides a bent structure of the semiconductor pattern 230 to achieve the multi-channel design.

The semiconductor pattern 230 in this embodiment, for example, has a multi-bent structure, and is overlapped with the scan line 210 at a plurality of areas to form multiple channel areas 232A and 232B. The semiconductor pattern 230 is a transparent pattern, so that the display aperture ratio of the pixel structure 200 is not affected by the multi-channel design in this embodiment. That is, the pixel structure 200 in this embodiment may maintain a good display aperture ratio while avoiding the current leakage.

The semiconductor pattern 230, for example, has a U-shaped doping area 234, and the semiconductor pattern 230 connecting two ends of the U-shaped doping area 234 intersects with the scan line 210 so as to form the channel area 232A and the channel area 232B. With the design, the polysilicon TFT 250 has a plurality of channel areas 232A, 232B, so as to improve the electrical property of the polysilicon TFT 250.

In detail, when the polysilicon TFT 250 is turned on, a transmission direction of the current in the channel areas 232A and 232B is, for example, perpendicular to the extension direction of the scan line 210. Therefore, widths D1 and D2 of the scan line 210 may affect lengths L1, L2 of the channel areas 232A, 232B. Generally speaking, the longer the lengths L1, L2 of the channel areas 232A, 232B are, the lower the leakage current of the polysilicon TFT 250 is. Therefore, in order to increase the length L2 of the channel area 232B, the width D2 of the scan line 210 in the channel area 232B is, for example, larger than the width D1 of the scan line 210 in other areas. Specifically, in other embodiments, in order to increase the length L1 of the channel area 232A, the width of the scan line 210 in the channel area 202A may be increased.

The semiconductor pattern 230 further includes a capacitor electrode 252 electrically connected with the drain area 238 and the pixel electrode 240, and located below the pixel electrode 240. In practice, in this embodiment, the doping area 234, the source area 236, the drain area 238, and the capacitor electrode 252 are made of a doped polysilicon material. In other embodiments, the pixel structure 200 may further include a common electrode (not shown) disposed between the capacitor electrode 252 and the pixel electrode 240. Furthermore, the drain area 238 electrically connected with the pixel electrode 240 through a contact window Td, and the source area 236 is electrically connected with the data line 220 through a contact window Ts. In this embodiment, the contact window Td and the contact window Ts are located at the same side of the scan line 210, and the semiconductor pattern 230 is appropriately bent into a U shape so as to repeatedly intersect with the scan line 210 at the channel area 232A and the channel area 232B.

Figure 3:
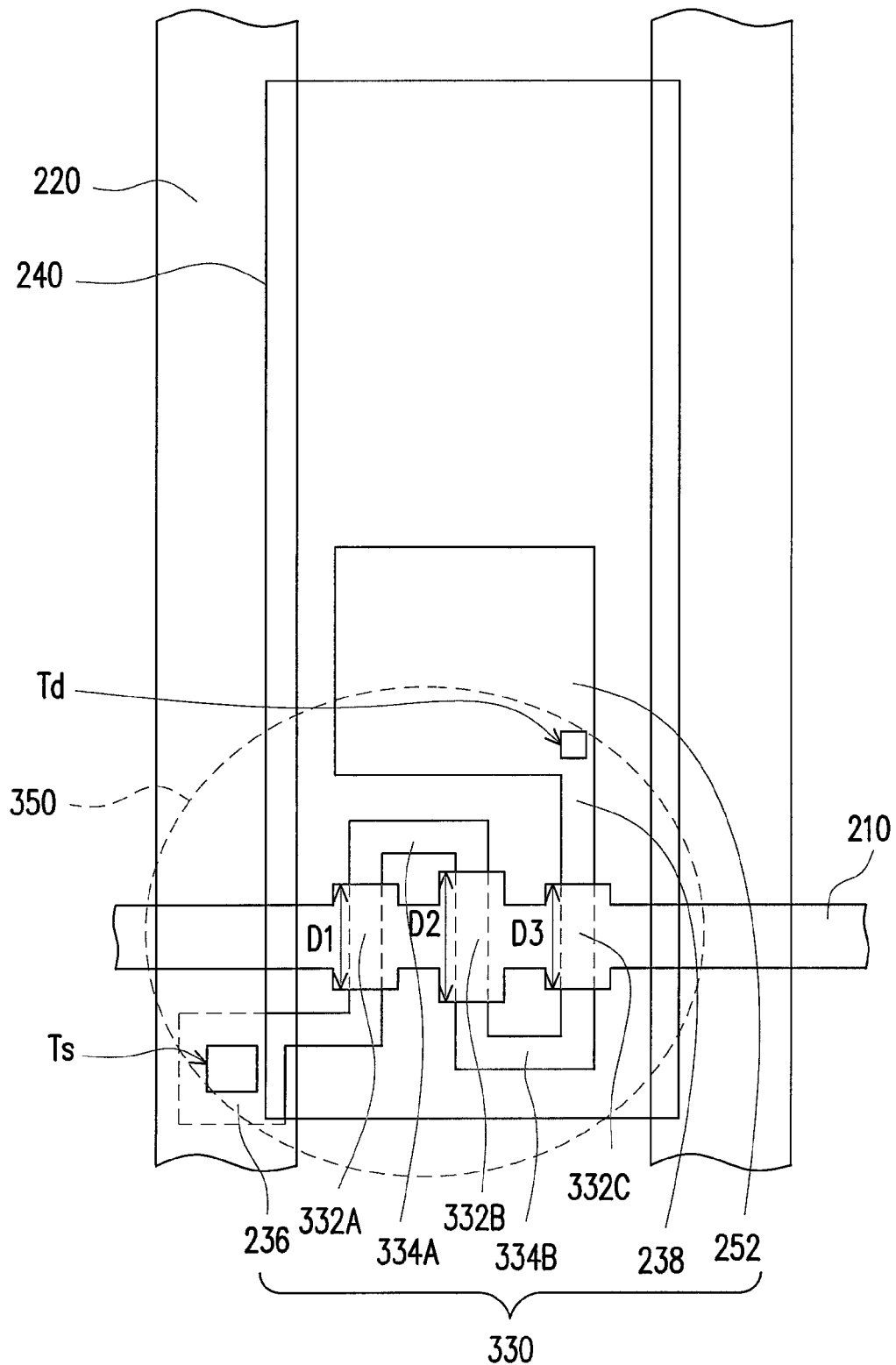
FIG. 3 is a schematic view of a pixel structure according to another embodiment of the present invention.

Certainly, the contact window Td and the contact window Ts may also be located at two opposite sides of the scan line 210. FIG. 3 shows a pixel structure according to another embodiment of the present invention. Referring to FIG. 3, the pixel structure 300 and the pixel structure 200 are designed under similar concept while the contact window Td and the contact window Ts of the pixel structure 300 are located at the two opposite sides of the scan line 210. Furthermore, the semiconductor pattern 330 of the pixel structure 300 has three channel areas 332A, 332B, 332C and two U-shaped doping areas 334A, 334B. Meanwhile, a part of the scan line 210 below the channel areas 332A, 332B, 332C, the source area 236, and the drain area 238 together form a polysilicon TFT 350.

In the present embodiment, the intersecting portion of the scan line 210 and the semiconductor pattern 330 has different widths D1, D2, D3. Therefore, the channel area 332A, the channel area 332B, and the channel area 332C may have different aspect ratios. In practice, the widths D1, D2, D3 of the scan line 210 in the channel areas 332A, 332B, 332C correspondingly may be larger than the widths of the scan line 210 in other areas, such that the polysilicon TFT 350 has a good electrical property. Moreover, the semiconductor pattern 330 is, for example, made of a polysilicon material having a light-transmissive property. Therefore, in this embodiment, the bent structure of the semiconductor pattern 330 may realize the multi-channel design of TFT 350, and the pixel structure 300 may have a good display aperture ratio.

Figure 4:
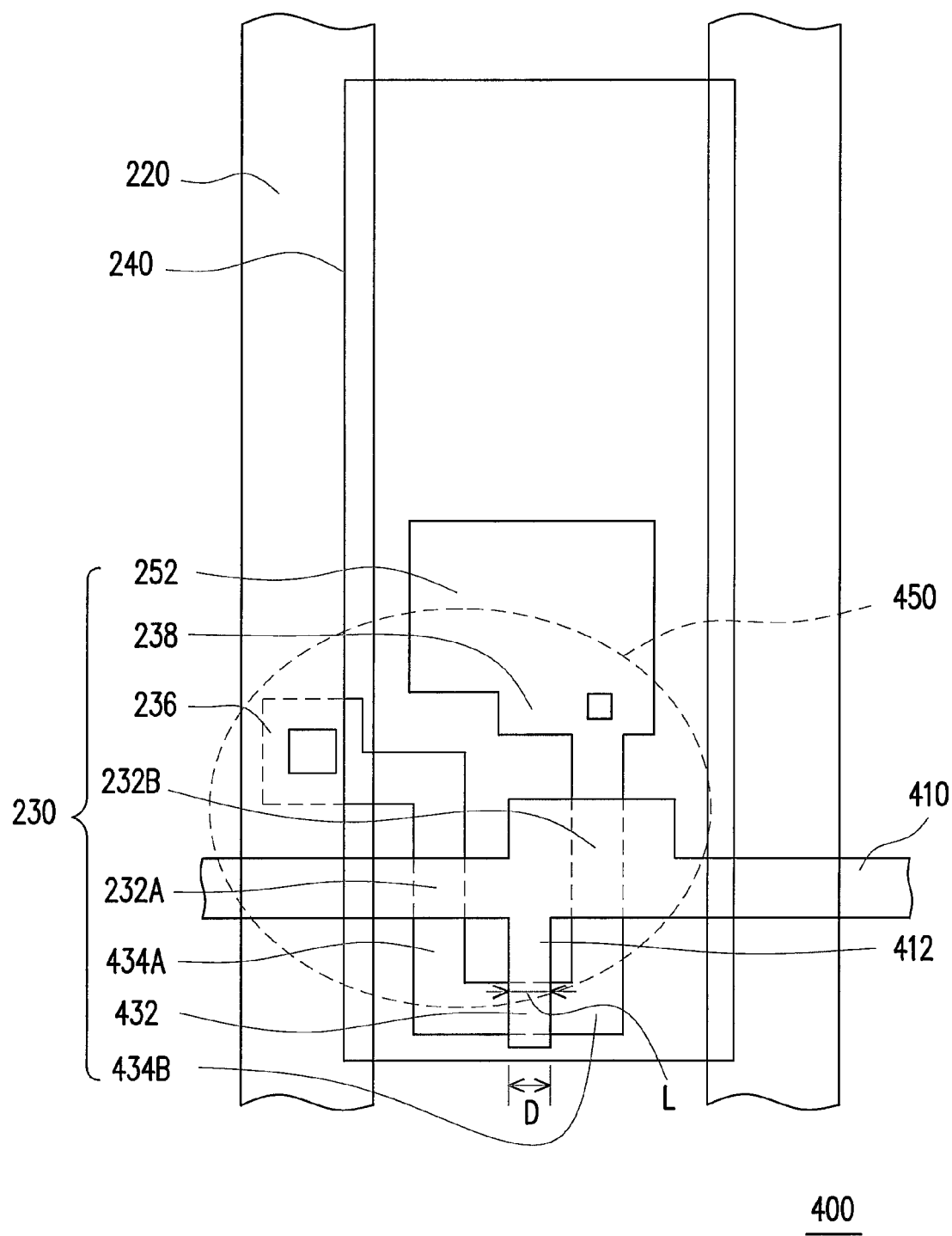
FIG. 4 is a schematic view of a pixel structure according to still another embodiment of the present invention.

FIG. 4 is a schematic view of a pixel structure according to still another embodiment of the present invention. Referring to FIG. 4, the pixel structure 400 is similar to the pixel structure 200 in FIG. 2, and the data line 220 interlaces with the scan line 410. The difference there between lies in that the scan line 410 has a branch 412, and the branch 412 intersects with the semiconductor pattern 230. The intersecting portion of the semiconductor pattern 230 and the branch 412 forms the channel area 432, and the doping areas 434A, 434B are located between the channel area 232A and the channel area 432, and between the channel area 232B and the channel area 432 respectively. In practice, the semiconductor pattern 230 in this embodiment is similar to the semiconductor pattern 230 in FIG. 2 in appearance, and the pixel structure 400 may have three channel areas 232A, 232B, 432 due to the design of the branch 412. Moreover, the shape of the doping areas 434A, 434B also changes from a U shape into two-L shape in appearance.

The semiconductor pattern 230 in the pixel structure 200 is used in the pixel structure 400 to form three channel areas 232A, 232B, 432, and thus a part of the scan line 410 below the channel areas 232A, 232B, 432, the source area 236, and the drain area 238 together form a polysilicon TFT 450. Due to the multi-channel design, the polysilicon TFT 450 staying in the turn-off state may not have leakage current easily.

Moreover, the branch 412 is a rectangular pattern, and compared with the conventional L-shaped branch 112, the design in this embodiment helps to maintain a good display aperture ratio of the pixel structure 400. The branch 412 and the capacitor electrode 252 are located at the two sides of the scan line 410 respectively, so the location and area of the capacitor electrode 252 are not affected by the disposition of the branch 142. That is, in accordance with different design demands, the capacitor electrode 252 may be disposed on any position at the area surrounded by the scan line 410 and the data line 220. Furthermore, the extension direction of the branch 412 is substantially perpendicular to the extension direction of the scan line 410, and a length of the channel area 432 below the branch 412 is substantially equal to the width D of the branch 412. Therefore, the line width variation of the scan line 410 and the branch 412 enables the channel areas 232A, 232B, 432 have different aspect ratio. In this embodiment, with the same design of the semiconductor pattern 230, the pixel structure 400 has more than two channel areas 232A, 232B, 432, so as to improve the quality of the pixel structure 400.

Figure 5A:
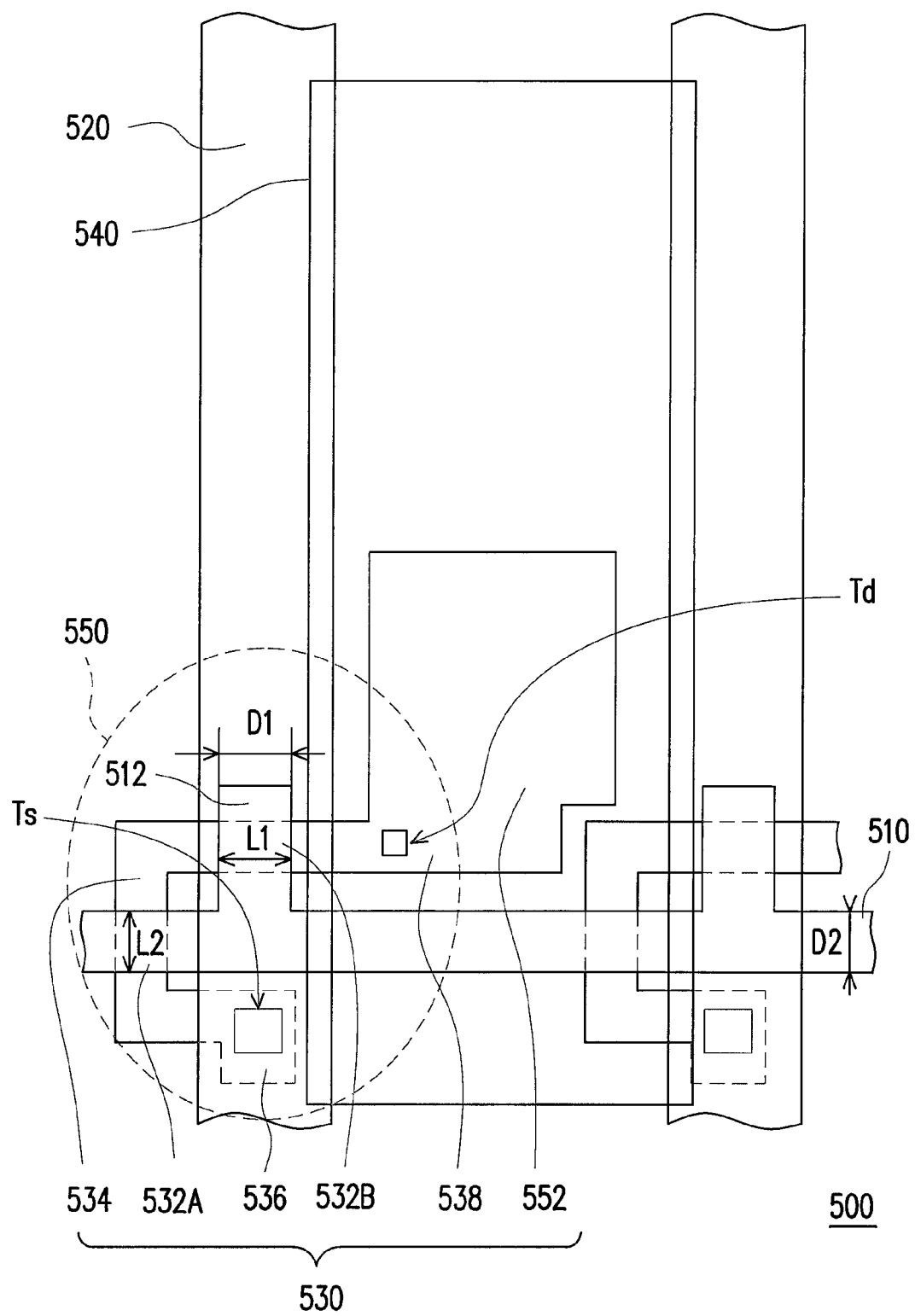
FIGS. 5A and 5B are schematic views of two pixel structures according to still another embodiment of the present invention.
Figure 5B:
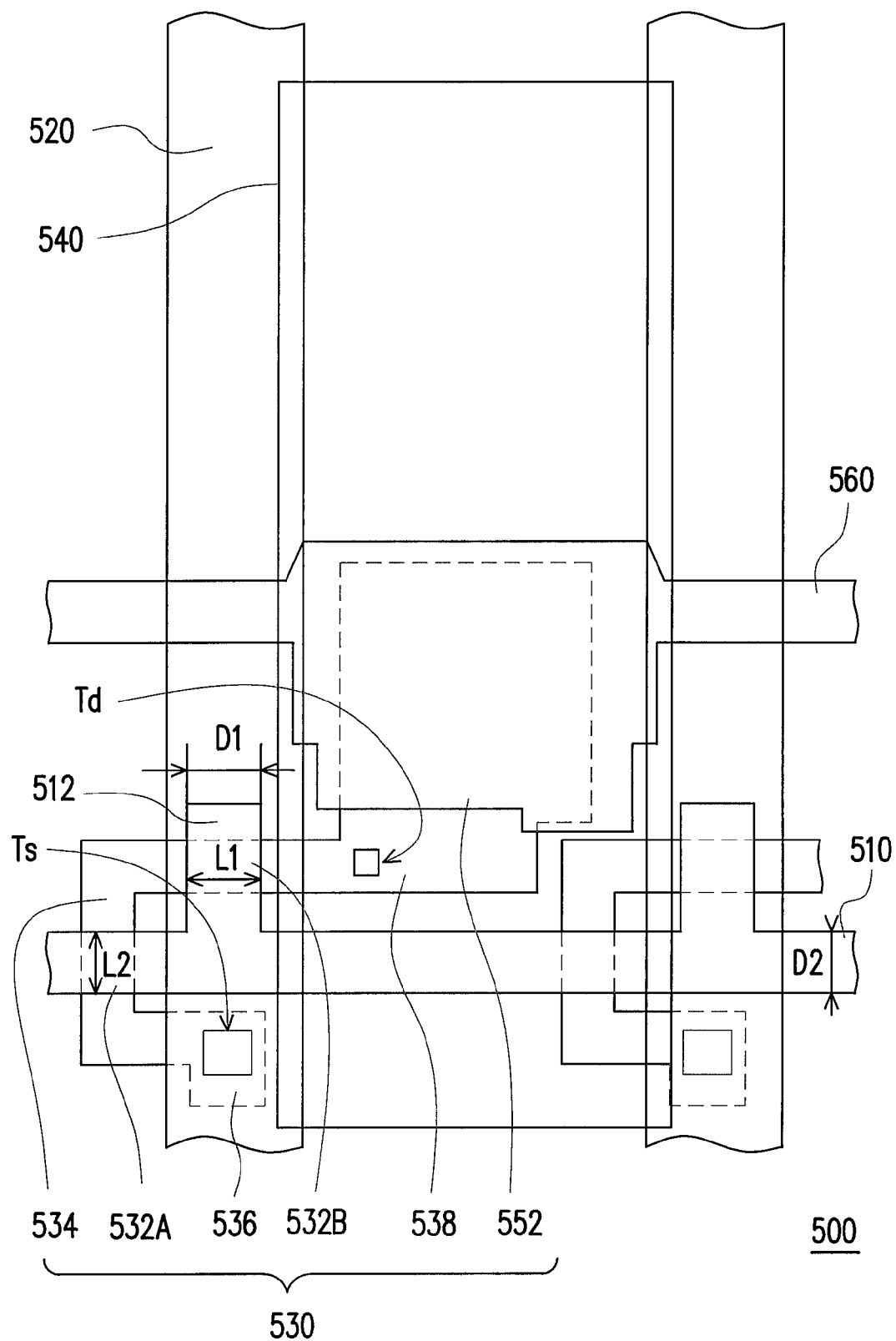

FIGS. 5A and 5B show two pixel structures according to still another embodiment of the present invention. Referring to FIG. 5, the pixel structure 500 includes a scan line 510, a data line 520, a semiconductor pattern 530, and a pixel electrode 540. The scan line 510 interlaces with the data line 520 and has a branch 512 located below the data line 520. The semiconductor pattern 530 includes at least two channel areas 532A and 532B, at least one doping area 534, a source area 536, and a drain area 538.

The channel areas 532A, 532B are located below the scan line 510 and have different aspect ratios. The doping area 534 is connected between the channel areas 532A, 532B. The pixel electrode 540 is electrically connected with the drain area 538, and the source area 536 is connected between the channel area 532A and the data line 520. Moreover, the drain area 538 is connected between the channel area 532B and the pixel electrode 540. Furthermore, the doping area 534 in this embodiment is in an L shape and is connected between the channel area 532A and the channel area 532B. A part of the scan line 510 below the channel area 532A and the channel area 532B, the source area 536, and the drain area 538 together form a polysilicon TFT 550.

In this embodiment, the semiconductor pattern 530 extends from a first side of the data line 520 to a second side of the data line 520. The source area 536 of the semiconductor pattern 530, for example, is electrically connected with the data line 520 through a contact window Ts, and the drain area 538 is electrically connected with the pixel electrode 540 through a contact window Td. In the pixel structure 500, the contact window Ts and the contact window Td are located at the two opposite sides of the scan line 510. Therefore, in this embodiment, the bent structure of the semiconductor pattern 530 span across the two sides of the data line 520, the scan line 510, and the branch 512 so as to be overlapped with the scan line 510 and the branch 512 at several areas. Therefore, the pixel structure 500 has a plurality of channel areas 532A, 532B, so as to reduce the leakage current when the polysilicon TFT 550 is turned off. In brief, the pixel structure 500 has a good performance. Furthermore, the branch 512 of the scan line 510 is located below the data line 520, so as to avoid limiting the display aperture ratio of the pixel structure 500.

The extension direction of the branch 512 is substantially perpendicular to the extension direction of the scan line 510, and a length L2 of the channel area 532B below the branch 512 is substantially equal to the width D1 of the branch 512. Therefore, in this embodiment, the lengths L2, L1 of the channel areas 532A, 532B are respectively related to the widths D1, D2 of the scan line 510 and the branch 512. The larger the widths D1, D2 of the scan line 510 and the branch 512 are, the lower the leakage current of the polysilicon TFT 550 will be.

Moreover, in order to stabilize the display voltage when the pixel structure 500 is used to display, the semiconductor pattern 530 may further include a capacitor electrode 552 located below the pixel electrode 540 and electrically connected with the drain area 538 and the pixel electrode 540. Furthermore, referring to FIG. 5B, the pixel structure 500 may also includes a common electrode 560 disposed between the pixel electrode 540 and the capacitor electrode 552. Since the branch 512 of the scan line 510 is located below the data line 520, the positions of the common electrode 560 and the capacitor electrode 552 are not influenced by the arrangement of the branch 512, such that the position design of the common electrode 560 and the capacitor electrode 552 is flexible.

Figure 6:
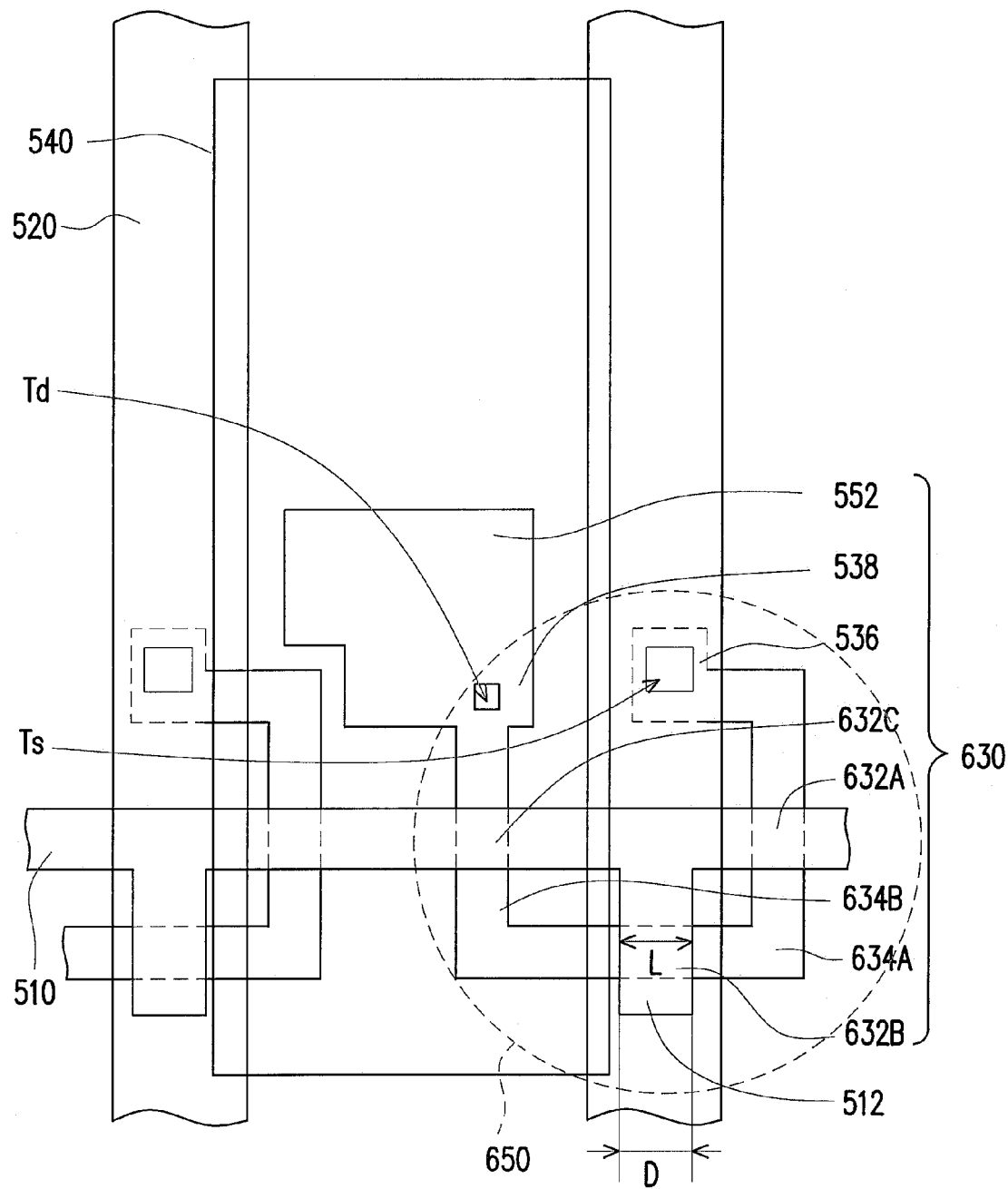
FIG. 6 is a schematic view of a pixel structure according to yet another embodiment of the present invention.

FIG. 6 shows a pixel structure according to still another embodiment of the present invention. Referring to FIG. 6, the pixel structure 600 is similar to the pixel structure 500, but differs in terms of the appearance of the semiconductor pattern 630 and the semiconductor pattern 530. The semiconductor pattern 630 of the pixel structure 600 includes three channel areas 632A, 632B, 632C and two doping areas 634A, 634B. Moreover, the doping areas 634A, 634B are connected between the channel areas 632A, 632B, 632C. The source area 536 is connected between the channel area 632A and the data line 520, and the drain area 538 is connected between the channel area 632C and the pixel electrode 540. Moreover, the capacitor electrode 552 and the branch 512 are located at two sides of the scan line 510.

In this embodiment, the extension direction of the branch 512 of the scan line 510 is substantially perpendicular to the extension direction of the scan line 510, and a length L of the channel area 632B below the branch 512 is substantially equal to the width D of the branch 512. Therefore, the larger the widths of the scan line 510 and the branch 51 are, the larger the channel lengths of the channel areas 632A, 632B, 632C will be, so as to improve the electrical property of the polysilicon TFT 650.

The branch 512 is located below the data line 520, so only the main line portion of the scan line 510 and the data line 520 in the design of the pixel structure 600 is the light-shading layer. Therefore, the pixel structure 600 may have a high display aperture ratio. Moreover, the semiconductor pattern 630 extends from a first side to a second side of the data line 520, so as to intersect with the scan line 510 and the branch 512 at several areas, i.e., the channel area 632A, 632B, 632C. The three channel areas 632A, 632B, 632C of the semiconductor pattern 630 are connected through the L-shaped doping areas 634A, 634B. The source area 536, the drain area 538, and a part of the scan line 510 below the channel areas 632A, 632B, and 632C together form the polysilicon TFT 650. Under this design, the polysilicon TFT 650 has multiple channels, and may not have leakage current when staying in the turn-off state, such that the pixel structure 600 has a good performance.

In view of the above, the present invention adopts different semiconductor pattern designs, and thus the pixel structure has a plurality of channel areas. The branch of the scan line is located below the data line, therefore the display aperture ratio of the pixel structure may not be limited by the branch of the scan line. That is, the pixel structure of the present invention has a high display aperture ratio. Moreover, in the pixel structure of the present invention, the semiconductor pattern is overlapped with the scan line at several areas to form a plurality of channel areas, so as to reduce the leakage current of the polysilicon TFT in the pixel structure when staying in the turn-off state. On the whole, the pixel structure of the present invention has a high display aperture ratio, as well as a good performance.

Though the present invention has been disclosed above by the preferred embodiments, they are not intended to limit the present invention. Anybody skilled in the art can make some modifications and variations without departing from the spirit and scope of the present invention. Therefore, the protecting range of the present invention falls in the appended claims and their equivalents.

What is claimed is:

1. A pixel structure, formed on a substrate and electrically connected with a scan line and a data line, the pixel structure comprising:
   a semiconductor pattern, comprising:
      at least two channel areas, located below the scan line, each of the two channel areas is a region of the semiconductor pattern overlapping with the scan line, and the two channel areas having different aspect ratios;
      at least one doping area, connected between the channel areas;
      a source area and a drain area; and
   a pixel electrode, electrically connected with the drain area, wherein the source area is connected between the data line and one of the two channel areas, and the drain area is connected between the pixel electrode and the other of the two channel areas,
   wherein the scan line overlapping with different channel areas has two different widths including a first width and a second width, a length of one of the channel areas is substantially equal to the first width, and a length of the other one of the channel areas is substantially equal to the second width.

2. The pixel structure according to claim 1, wherein the scan line comprises a branch substantially perpendicular to the scan line.

3. The pixel structure according to claim 2, wherein one of the two channel areas is located below and overlapped with the branch, and the length of the channel area below the branch is substantially equal to a width of the branch.

4. The pixel structure according to claim 1, wherein the semiconductor pattern comprises a polysilicon pattern.

5. The pixel structure according to claim 4, wherein the semiconductor pattern further comprises a capacitor electrode electrically connected with the drain area and the pixel electrode, and located below the pixel electrode.

6. The pixel structure according to claim 5, further comprising a common electrode disposed between the capacitor electrode and the pixel electrode.

7. The pixel structure according to claim 1, wherein the doping area is in an L shape or a U shape.

8. The pixel structure according to claim 1, wherein a part of the scan line above the channel area, the source area, and the drain area form a polysilicon thin film transistor (TFT).

9. A pixel structure, formed on a substrate and electrically connected with a scan line and a data line, the pixel structure comprising:
   a semiconductor pattern, comprising:
      at least two channel areas, located below the scan line, each of the two channel areas is a region of the semiconductor pattern overlapping with the scan line, and the two channel areas having different aspect ratios;
      at least one doping area, connected between the channel areas;
      a source area and a drain area; and
   a pixel electrode, electrically connected with the drain area, wherein the source area is connected between the data line and one of the two channel areas, and the drain area is connected between the pixel electrode and the other of the two channel areas,
   wherein the scan line overlapping with different channel areas has two different widths including a first width and a second width, the first width and the second width are substantially perpendicular to an extension direction of the scan line, a length of one of the channel areas is substantially equal to the first width, and a length of the other one of the channel areas is substantially equal to the second width.

10. The pixel structure according to claim 9, wherein the scan line comprises a branch substantially perpendicular to the scan line.

11. The pixel structure according to claim 10, wherein one of the two channel areas is located below and overlapped with the branch, and the length of the channel area below the branch is substantially equal to a width of the branch.

12. The pixel structure according to claim 9, wherein the semiconductor pattern comprises a polysilicon pattern.

13. The pixel structure according to claim 12, wherein the semiconductor pattern further comprises a capacitor electrode electrically connected with the drain area and the pixel electrode, and located below the pixel electrode.

14. The pixel structure according to claim 13, further comprising a common electrode disposed between the capacitor electrode and the pixel electrode.

15. The pixel structure according to claim 9, wherein the doping area is in an L shape or a U shape.

16. The pixel structure according to claim 9, wherein a part of the scan line above the channel area, the source area, and the drain area form a polysilicon thin film transistor (TFT).

* * * * *